United States Patent

Swarbrick et al.

[11] Patent Number: 6,085,414
[45] Date of Patent: Jul. 11, 2000

[54] METHOD OF MAKING A FLEXIBLE CIRCUIT WITH RAISED FEATURES PROTRUDING FROM TWO SURFACES AND PRODUCTS THEREFROM

[75] Inventors: David Bryan Swarbrick, Mission Viejo; Bao Le, Santa Ana; Oswaldo Ernesto Caballero, Perris, all of Calif.

[73] Assignee: Packard Hughes Interconnect Company, Irvine, Calif.

[21] Appl. No.: 09/126,122

[22] Filed: Jul. 30, 1998

Related U.S. Application Data

[63] Continuation-in-part of application No. 08/698,408, Aug. 15, 1996.

[51] Int. Cl.[7] .................................................. H05K 3/02
[52] U.S. Cl. ................................. 29/847; 29/831; 205/78
[58] Field of Search ................................ 29/847, 426.2, 29/426.4, 881, 846, 831; 156/150, 289; 205/67, 78

[56] References Cited

U.S. PATENT DOCUMENTS

| | | | |
|---|---|---|---|
| 3,778,899 | 12/1973 | Johnson | 29/426.2 |
| 5,097,101 | 3/1992 | Trobough | 29/846 |
| 5,207,887 | 5/1993 | Crumly et al. | 205/78 |
| 5,307,561 | 5/1994 | Feigenbaum et al. | 29/846 |
| 5,477,612 | 12/1995 | Roberts | 29/846 |
| 5,617,629 | 4/1997 | Ekstrom | 29/846 |
| 5,689,879 | 11/1997 | Urasaki et al. | 29/846 |
| 5,761,801 | 6/1998 | Gebhardt et al. | 29/846 |
| 5,924,193 | 7/1999 | Crumly et al. | 29/846 |

FOREIGN PATENT DOCUMENTS

| | | | |
|---|---|---|---|
| 54-25225 | 8/1979 | Japan | 29/846 |
| 59-220049 | 12/1984 | Japan | 29/847 |
| 1-51690 | 2/1989 | Japan | 29/847 |
| 1-266789 | 10/1989 | Japan | 29/847 |
| 3-201498 | 9/1991 | Japan | 29/846 |
| 5-7065 | 1/1993 | Japan | 29/846 |
| 6-152104 | 5/1994 | Japan | 29/846 |

*Primary Examiner*—Lee Young
*Assistant Examiner*—A. Dexter Tugbang
*Attorney, Agent, or Firm*—Patrick M. Griffin

[57] ABSTRACT

A process using a shim stock or foil to make flexible circuits having raised pressure contact features protruding outwardly from two surfaces. A first set of raised electrical pressure contact features are made by placing a shim stock or foil of stainless-steel on a piece of soft metal or other suitable substrate and forcing a tool into the foil to form dimples in one face. Thereafter, the foil is turned over and the process repeated on the other face of the foil. The resultant foil includes a first face having a first dimple and a first bump extending outwardly from the first face. A flash coating is formed on the foil and electrical traces are deposited on the first face of the foil including into the first dimple and over the first bump. A dielectric substrate is selectively deposited over the electrical traces and the complete subassembly is removed from the foil. A flash coating is etched away and optionally a second dielectric substrate is selectively deposited over the electrical traces. The resulting flexible circuit has raised features protruding from two surfaces.

7 Claims, 3 Drawing Sheets

METHOD OF MAKING A FLEXIBLE CIRCUIT WITH RAISED FEATURES PROTRUDING FROM TWO SURFACES AND PRODUCTS THEREFROM

This is a continuation-in-part of U.S. Ser. No. 08/698,408, filed Aug. 15, 1996.

TECHNICAL FIELD

This invention generally relates to a method using a shim stock or foil to make flexible circuits with raised pressure contact electrical features protruding from two surfaces.

BACKGROUND OF THE INVENTION

Heretofore flexible circuits have been made with raised features protruding from both surfaces of the flexible circuit. However, the circuits are made using a mandrel to produce raised features on one surface of the flexible circuit and thereafter raised features on the other surface of the circuit or produce by plating up and etching back techniques. This requires handling of the flexible circuit at times without supporting substrate which is difficult and the plating up and etching back techniques are costly.

The present invention provides alternatives to and advantages over the prior art.

SUMMARY OF THE INVENTION

The present invention includes a process using a shim stock or foil to make flexible circuits having raised pressure contact features protruding outwardly from two surfaces. A first set of raised electrical pressure contact features are made by placing a shim stock or foil of stainless-steel on a piece of soft metal or other suitable substrate and forcing a tool into the foil to form dimples in one face. Thereafter, the foil is turned over and the process repeated on the other face of the foil. The resultant foil includes a first face having a first dimple and a first bump extending outwardly from the first face. A flash coating is formed on the foil and electrical traces are deposited on the first face of the foil including into the first dimple and over the first bump. A dielectric substrate is selectively deposited over the electrical traces and the complete subassembly is removed from the foil. The flash coating is etched away and optionally a second dielectric substrate is selectively deposited over the opposite side of the electrical traces. The resulting flexible circuit has raised features protruding from two surfaces.

These and other objects, features and advantages of present invention become apparent from the following brief description of the drawings, detailed descriptions, and appended claims and drawings.

DESCRIPTION OF THE PREFERRED EMBODIMENT

Figure 1:
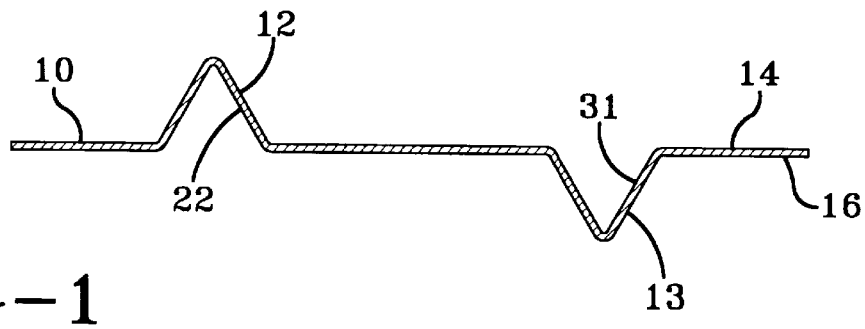
FIG. 1 illustrates a foil having a first face having a first dimple and a first bump form thereon and a second face having a second bump and second dimple formed thereon according to the present invention.

Referring now to FIG. 1, according to the present invention flexible circuits are fabricated from a stainless-steel shim stock or foil 10 so that there are dimples 31, 22 and bumps 12, 13 formed in each of the faces of the foil. Dimples 31 are formed in a first face 14 of the foil stock by placing the foil on an adhesive layer with the second face 16 down and overlying a piece of soft metal (not shown) such as aluminum. A tool is forced into the first face of the foil to form of dimple in the first face. The thickness of the foil is chosen so that the first face 14 is dimpled, and the second face 16 is deformed so that of bump 13 is formed protruding from the second face 16 corresponding to at location the dimple 31 formed in the first face. Inwardly facing dimples are formed by turning the shim stock over and dimpling the second face 16 any similar manner. This provides a dimple 22 in the second face and a bump 12 extending upwardly from the first face 14 of the foil. The adhesive layers are thereafter removed by dissolving the same an aqueous solvent.

The foil typically is from 2–4 mils thick and can be flash plated with copper and circuits constructed thereon in a manner to be described hereafter. After forming the dimples in the faces of the foil, naturally the outwardly extending bumps are slightly larger than the dimensions of the tool utilized to form the dimples. A once the outwardly facing dimples are formed, preferably a layer of adhesive is applied to the foil and the foil is secured and laminated onto a convenient substrate 20 such as a fiberglass board or a flexible circuit such as a polyimide substrate as the carrier to form a more suitable size mandrel. Optionally, the foil itself without the carrier substrate may be utilized to construct a flexible circuit thereon. During the process of laminating the carrier substrate to the foil, the inwardly extending bump 13 forces itself into the substrate 20 and at least a portion of the dimple 22 in the second face 16 is filled with the heated substrate material. However, due to the strength of the foil there is no need to back fill the dimple. The foil in the substrate 20 may be laminated together at temperatures ranging from printer 375 degrees F to 400 degrees F and pressures of 275 psi to 325 psi. Unlike prior art mandrels that are fabricated from a solid stainless-steel layer having thickness of 0.06 inches or greater, the mandrel is relatively lightweight and can be moved from station to station in a manner similar to that used in manufacturing circuits on circuit boards.

Using the present invention, raised pressure contact electrical features protruding from on both sides of the flexible circuit can be made simultaneously by depositing an electrically conductive material into the dimple and over the bump of the foil, thus reducing steps, and maintaining the circuit on the mandrel during the entire operation. Since raised pressure contact electrical features on both sets of the flexible circuit are created simultaneously. Alternatively, if the circuit pattern is symmetrical both sides of the foil can be used to produce circuits in the carrier support substrate (or mandrel subassembly) is not need. That is because the first face of the foil includes a first dimple and a first bump corresponding to a second bump and second dimple respectively of the second face.

Figure 2:
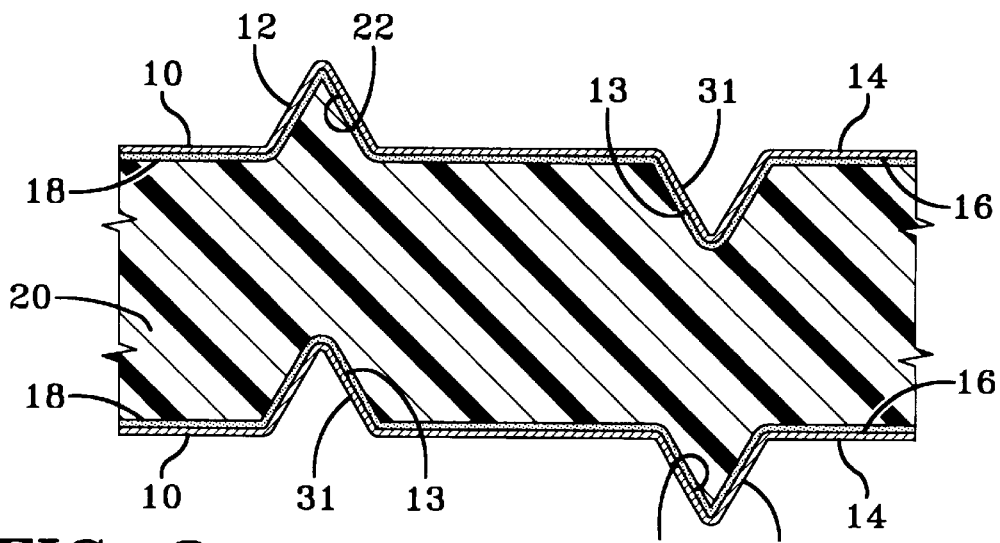
FIG. 2 illustrate steps of securing and laminating the foil of FIG. 1 onto a carrier substrate according to the present invention.

If a foil/carrier support substrate combination is used to make a mandrel, the mandrel can also be sprocketed for registration and handling, allowing for reel to reel processing similar to that utilized in many print circuit board production lines. Still further, the second foil may be secured to the bottom surface of the carrier support and both sides of the mandrel assembly can be utilized to fabricate circuits thereon as shown generally in FIG. 2.

A semi added to process for fabricating the flexible circuit with raised pressure contact electrical features utilizing a mandrel is disclosed in Crumly et al., U.S. Pat. No. 5,207,887, issued May 4, 1993, the disclosure of which is hereby incorporated by reference. The general description of processes as adapted for the present invention is described hereafter.

Figure 3:
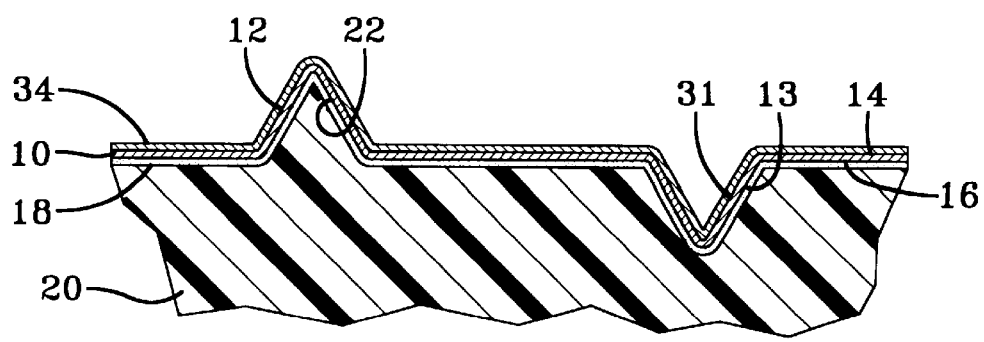
FIG. 3–10 illustrate a semi-additive to process using the foil to make flexible circuits having raised features protruding from two surfaces on a foil according to the present invention.

A shown in FIG. 3, the foil or the mandrel and its dimples 31 and bumps 12 is then covered with a copper coating 34, typically referred to as a flash plating or flash coating, which covers the entire surface of the foil, including the surface of the bumps 12 and dimples 31. The flash coating copper is applied by electroplating or other known techniques and provides a thin conductive coating that prevents the adhesive (that will be used to laminate the circuits substrate) from adhering to the foil surface. Flash plating is a conventional electrolytic plating formed in a very short or momentary operation so that only a very thin plating coat is provided. The flash coating is very thin compared to the thickness of the electrical circuit traces that will be made thereon. For example, for circuit trace of 1½ mils thickness, the flash coating of copper on the foil will have a thickness of 0.01–0.2 mils. The thin flash coating is employed because it can be easily released from the stainless-steel foil, and in addition, may be readily removed from the lamination after separation from the foil using a flash etching process, which is a very short or momentary etching process. Obviously, other methods for coating the foil with a thin coating of conductive material that is readily separable from the foil and which can be readily removed from the completed electrical traces may be employed in the place of the electrolytic flash plating. Such methods may include sputtering, vapor deposition and electroless plating. If deemed necessary or desirable, the mandrel may be made of a non-electrically conductive material because of the thin electrically conductive coating itself enables the additive electroplating of the circuit traces and raised pressure contact electrical features. The coating, for a dielectric mandrel, can be applied by electroless plating, sputtering or additional conductive particles in solution. No pattern of non-conductive material, such as Teflon, these to be probably affixed to the mandrel. Instead, the flash plated copper is covered with a photoresist 36, which is then optically exposed through a mask defining a pattern of the desired circuit and developed. The photoresist that has not been polymerized is then removed to leave the partially completed assembly in the configuration illustrated in FIG. 4. As shown, the flash plated coating 34 now bears a pattern of the photoresist 36 that is the negative pattern of the circuit trace pattern to be fabricated on the foil.

Figure 4:
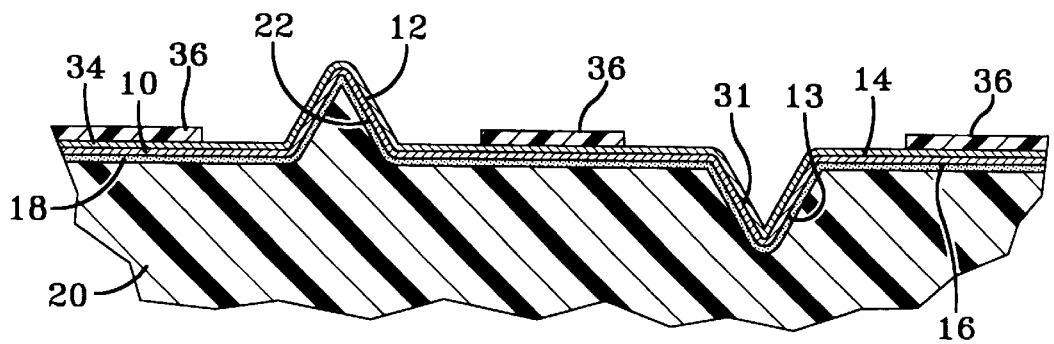
Figure 5:
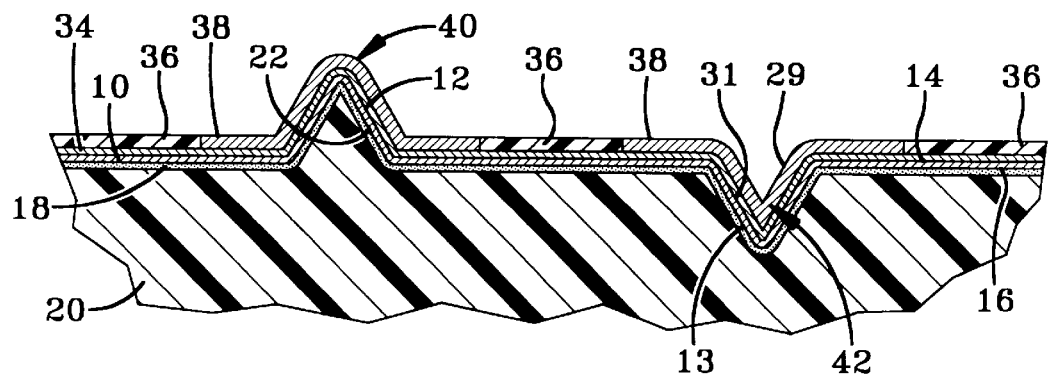

The assembly of FIG. 4 is then subjected to a suitable additive electroforming process, such as, for example, electroplating to plate up copper traces 38 over the foil bump 12 and into the dimple 31 (as shown in FIG. 5). The copper traces are plated directly onto these portions of the flash plated copper coating 30 for that are not covered with the negative pattern of the developed photoresist 36. Thus the plating process simultaneously forms circuit traces 38 and the raised pressure contact features 40, 42.

Figure 6:
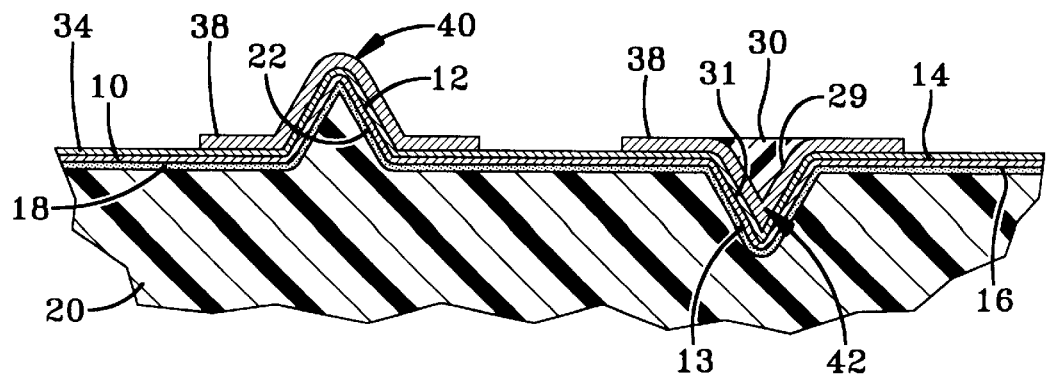
Figure 7:
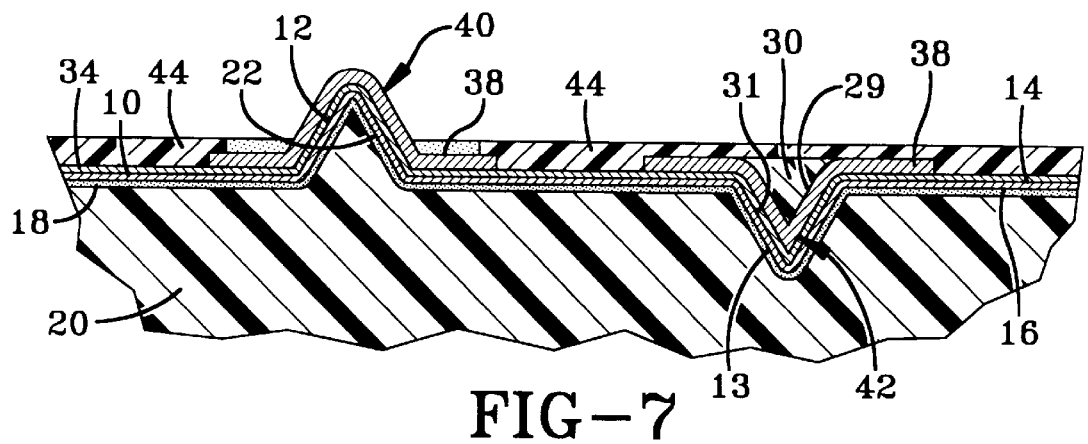
Figure 8:
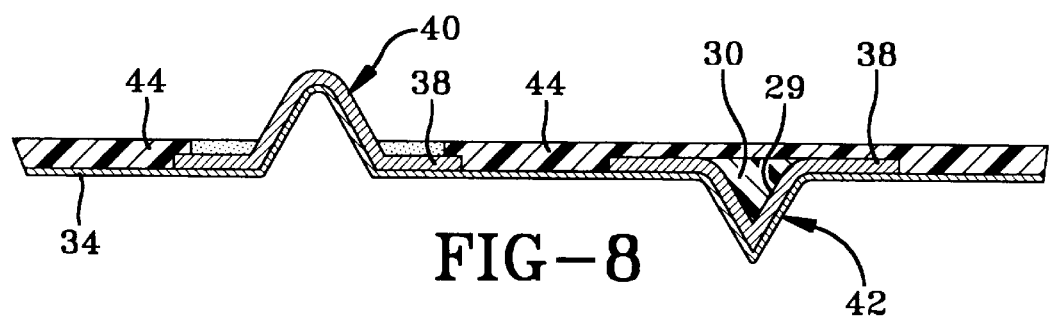

The photoresist 36 is then stripped to leave the circuit traces 38 and raised pressure contact electrical features 40, 42 of the flash plated copper coating which is still on the foil, at shown in FIG. 6. The circuit traces 38 and raised pressure contact electrical features 40, 42 are partially hollow, having a depression 29 (FIGS. 5 and 8). If deemed necessary or desirable, the depression 29 formed in the electroplated raised feature 40, 42 may be filled with a solid material 30 (FIG. 6 and 9) by placing a drop of epoxy into the depressions 29 and then allowing epoxy to cure. The depression 29 males so be filled with the adhesive (not shown) used to adhere a dielectric layer 44. Now a layer of suitable dielectric adhesive 44 such as a layer Kapton and an adhesive are laminate to the foil with the traces and raised features thereon understood suitable high temperature and pressures. Only that side of the traces that are in direct contact with the flash coating on the foil is not laminated by the adhesive/Kapton layer 44.

Assembly shown in FIG. 8, including the flash coating 34, traces 38, and raised features 40, 42 and the adhesive/Kapton layer 44 is removed from the foil 10.

Thus it will be seen that the foil has been initially coated with the protective layer of flash plated copper 34, the assembly of dielectric/adhesive substrate and circuit traces and raised features can be readily separated from the foil, together with the flash coating. This separated is subassembly shown removed from the foil in FIG. 8.

Figure 9:
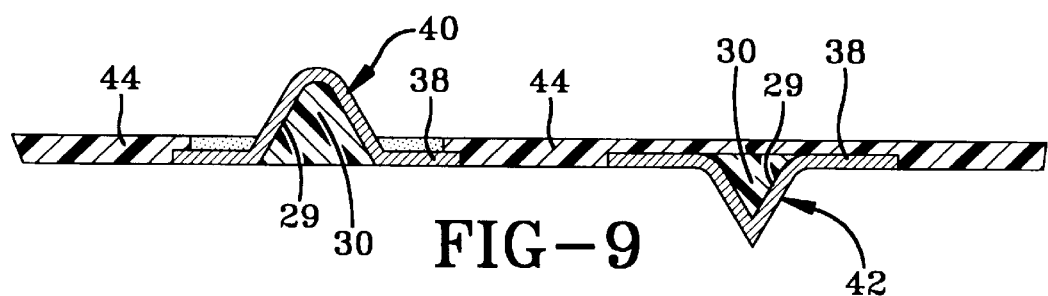
Figure 10:
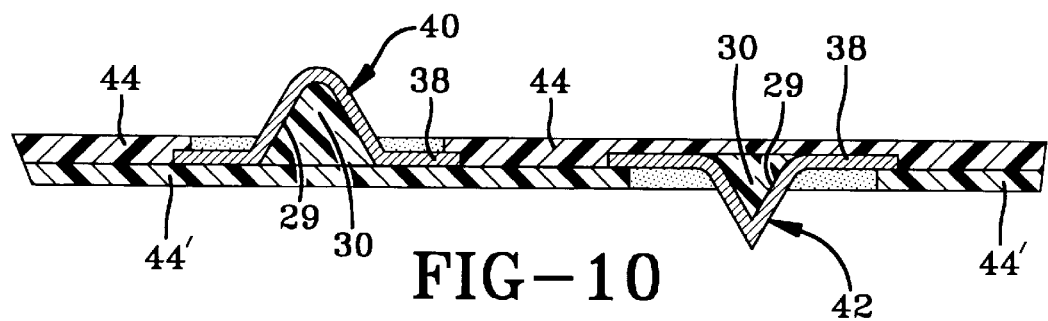

Then, as indicated in FIG. 9, the flash coating 34 which covers the entire lower (as viewed from FIG. 8) surface of the subassembly of FIG. 8, is removed by a flash etching process. Thereafter a second dielectric layer 44' such as Kapton is applied further support the flexible substrate and raised pressure contact electrical features 40, 42. Both of the dielectric layers 44, 44' include holes formed therein to accommodate the raised pressure contact electrical features so that the features protrude outwardly from the generally planar surface of both sides of the dielectric layers to allow for electrical contact with the raised features 40, 42.

If deemed necessary or desirable, the removal of flash coating may be controlled by a "stop" layer of gold, which will protect the thicker copper circuit from flash etching removal. To this end, flash coated foil with the photolithographically defined resist pattern 36 in place, may be plated with a thin layer of gold, about the 0.00006 inches thick, upon which the circuitry 38 will be plated. This patterned gold "stop" layer allows the flash plated coating to be removed by the flash etching from the dielectric, but protects the copper circuit 38 traces.

When reference is made to the raised pressure contact electrical features of the present invention this means a raised feature which is electrically conductive and which is designed to engage another electrically conductive surface which is preferably flat such as a contact pad of another flexible circuit, print circuit board, or other electronic device. In this case, the electrical contact is primarily due to the pressure contact of the raised feature of the flexible circuit against the flat contact surface of the other electronic component. In this sense, the present invention raised pressure contact electrical feature is drastically different than the traditional electrical contact means that employee a female terminal and a female terminal.

What is claimed is:

1. A process of making a flexible circuit having first and second opposite surfaces and raised pressure contact electrical features protruding outwardly from the surfaces of the flexible circuit comprising:

providing a foil having a first and second opposite face, forcing a tool into the first face to provide a first dimple in the first face and a corresponding second bump extending outwardly from the second face of the foil, turning the foil over and forcing the tool into the second face to provide a second dimple in the second face and a corresponding first bump extending outwardly from the first face of the foil, thereafter constructing a first flexible circuit on at least the first face of the foil comprising coating the first face of the foil including the first dimple and the first bump extending outwardly from the first face of the foil with a first electrically conductive material to provide a flash coating so that the flash coating is relatively separable from the foil including the first dimple and the first bump, selectively depositing a second electrically conductive material over the flash coating to form a pattern of circuit traces on the flash coating, at least a portion of one of the traces extending into the first dimple and at least another portion of one of the traces deposited over the first bump extending outwardly from the first face of the foil, selectively laminating a dielectric substrate onto the traces wherein said coating effectively blocks the dielectric substrate from adhering to the foil, removing, the traces, dielectric substrate and the flash coating from the foil, and thereafter removing the flash coating to provide a flexible circuit, the dielectric substrate having the first and second opposite surfaces and the pattern of circuit traces carried by the dielectric substrate including a first raised pressure contact electrical feature extending outwardly from the first surface of the dielectric substrate and a second raised pressure contact electrical feature extending outwardly from the second surface of the dielectric substrate, the first raised pressure contact electrical feature being formed by the second electrically conductive material deposited in the first dimple in the first face of the foil and the second raised pressure contact electrical feature being formed by the second electrically conductive material deposited over the first bump extending outwardly form the first face of the foil.

2. A process is set forth in claim 1 wherein said foil is less than $4/1000$ inches thick.

3. A process as set forth in claim 1 further comprising the step of adhering a support substrate to the foil prior to constructing the flexible circuit on the first face of the foil.

4. A process as set forth in claim 1 further comprising the step of constructing a second flexible circuit on the second face of the foil comprising coating the second face of the foil including the second dimple and the second bump extending outwardly from the second face of the foil with a third electrically conductive material to provide a second flash coating that is relatively separable from the foil including the second dimple on the second bump extending outwardly from the second face of the foil, selectively depositing a fourth electrically conductive material on the flash coating to form a second set of circuit traces on the flash coating, at least a portion of one of the traces extending into the second dimple and at least another portion of one of the traces deposited over the second bump extending outwardly from the second face of the foil, laminating a second dielectric substrate onto the second set of circuit traces wherein the second flash coating effectively blocks the second dielectric substrate from adhering to the foil, removing the second set of traces, second dielectric substrate, and the second flash coating from the foil, and thereafter removing the second flash coating to provide a second flexible circuit, the second dielectric substrate having first and second opposite surfaces and the second set of circuit traces carried by the second dielectric substrate including a third raised pressure contact electrical feature protruding outwardly from the first surface of the second dielectric substrate and a fourth raised pressure contact electrical feature protruding outwardly from the second surface of the second dielectric substrate, the third raised pressure contact electrical feature being formed by the second electrically conductive material deposited in the second dimple and the fourth raised pressure contact electrical feature being formed by the second electrically conductive material deposited over the second bump extending from the second bump face of the foil.

5. A process of making a flexible circuit having first and second opposite surfaces and raised pressure contact electrical features protruding outwardly from the two surfaces of the flexible circuit comprising:

providing a foil having a first face having a first dimple formed therein and a first bump extending outwardly from the substantially planar for surface of the first face that surrounds the first bump, thereafter constructing a first circuit on at least the first face of the foil comprising coating the first face of the foil including the first dimple and first bump extending outwardly from the first face of the foil with a first electrically conductive material to provide a flash coating so that the flash coating is relatively separable from the foil including the first dimple and the first bump, selectively depositing a second electrically conductive material over the flash coating to form a pattern of circuit traces on the flash coating, at least a portion of one of the traces extending into the first dimple and at least another portion of one of the traces deposited over the first bump extending outwardly from the first face of the foil, selectively laminating a dielectric substrate onto the traces wherein said coating effectively blocks the dielectric substrate from adhering to the foil, removing the traces, the dielectric substrate and the flash coating from the foil, and thereafter removing the flash coating to provide a flexible circuit the dielectric substrate having the first and second opposite surfaces and the pattern of circuit traces carried by the dielectric substrate including a first raised pressure contact electrical feature extending from the first surface of the dielectric substrate and a second raised pressure contact electrical feature extending outwardly form the second surface of the dielectric substrate, the first raised pressure contact electrical feature being formed by the second electrically conductive material deposited in the first dimple and the second raised pressure contact electrical feature being formed by the second electrically conductive material deposited over the first bump extending outwardly from the first face of the foil.

6. A process is set forth in claim 5 wherein said foil is less than $4/1000$ inches thick.

7. A process as set forth in claim 5 further comprising the step of adhering a support substrate to the foil prior to constructing the flexible circuit on the first face of the foil.

* * * * *